US009236462B2

(12) United States Patent
Briere

(10) Patent No.: US 9,236,462 B2
(45) Date of Patent: *Jan. 12, 2016

(54) PROGRAMMABLE GATE III-NITRIDE POWER TRANSISTOR

(75) Inventor: Michael A. Briere, Manhattan Beach, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 67 days.

This patent is subject to a terminal disclaimer.

(21) Appl. No.: 13/334,720

(22) Filed: Dec. 22, 2011

(65) Prior Publication Data

US 2012/0091470 A1    Apr. 19, 2012

Related U.S. Application Data

(63) Continuation of application No. 11/857,113, filed on Sep. 18, 2007, now Pat. No. 8,084,785, and a continuation-in-part of application No. 11/460,725, filed on Jul. 28, 2006, now Pat. No. 8,183,595.

(60) Provisional application No. 60/703,931, filed on Jul. 29, 2005.

(51) Int. Cl.
*H01L 29/778* (2006.01)
*H01L 29/66* (2006.01)
*H01L 29/80* (2006.01)
*H01L 29/423* (2006.01)
*H01L 29/772* (2006.01)
*H01L 29/20* (2006.01)
*H01L 29/51* (2006.01)

(52) U.S. Cl.
CPC .......... *H01L 29/778* (2013.01); *H01L 29/4232* (2013.01); *H01L 29/513* (2013.01); *H01L 29/66431* (2013.01); *H01L 29/7787* (2013.01); *H01L 29/803* (2014.09); *H01L 29/2003* (2013.01); *H01L 29/42328* (2013.01); *H01L 29/42336* (2013.01); *H01L 29/51* (2013.01); *H01L 29/518* (2013.01); *H01L 29/772* (2013.01)

(58) Field of Classification Search
CPC ....................................... H01L 31/06
USPC ....................................... 257/192
See application file for complete search history.

(56) References Cited

U.S. PATENT DOCUMENTS

| | | | |
|---|---|---|---|
| 6,521,961 B1 * | 2/2003 | Costa et al. | 257/402 |
| 6,617,653 B1 | 9/2003 | Yokogawa | |
| 6,654,604 B2 | 11/2003 | Yokogawa | |
| 6,674,131 B2 | 1/2004 | Yokogawa | |
| 7,723,752 B2 | 5/2010 | Yoshida | |
| 7,851,825 B2 | 12/2010 | Suh | |
| 8,084,785 B2 * | 12/2011 | Briere | 257/194 |
| 8,183,595 B2 * | 5/2012 | Briere | 257/194 |
| 2003/0227061 A1 | 12/2003 | Yokogawa | |
| 2003/0234420 A1 | 12/2003 | Forbes | |
| 2005/0189561 A1 * | 9/2005 | Kinzer et al. | 257/192 |
| 2007/0026587 A1 | 2/2007 | Briere | |
| 2007/0187718 A1 * | 8/2007 | Suzuki et al. | 257/194 |
| 2008/0179762 A1 | 7/2008 | Cho | |
| 2011/0241019 A1 | 10/2011 | Beach | |

FOREIGN PATENT DOCUMENTS

JP    2009-503874    1/2009

* cited by examiner

*Primary Examiner* — William Harriston
(74) *Attorney, Agent, or Firm* — Farjami & Farjami LLP

(57) ABSTRACT

A III-nitride semiconductor device which includes a charged floating gate electrode.

20 Claims, 2 Drawing Sheets

PROGRAMMABLE GATE III-NITRIDE POWER TRANSISTOR

RELATED APPLICATIONS

This is a continuation of application Ser. No. 11/857,113 filed Sep. 18, 2007 now U.S. Pat. No. 8,084,785. The present application is a continuation-in-part of U.S. patent application Ser. No. 11/460,725, filed on Jul. 28, 2006 now U.S. Pat. No. 8,183,595, entitled NORMALLY OFF III-NITRIDE SEMICONDUCTOR DEVICE HAVING A PROGRAMMABLE GATE, which is based on and claims priority to U.S. Provisional Patent Application No. 60/703,931, filed on Jul. 29, 2005, entitled NORMALLY OFF III-NITRIDE SEMICONDUCTOR DEVICE HAVING A PROGRAMMABLE GATE, the entire disclosures of which are incorporated herein by reference.

FIELD OF THE INVENTION

The present application relates to power semiconductor devices, and more particularly to III-nitride power semiconductor devices.

DEFINITION

As referred to herein a III-nitride semiconductor or III-nitride refers to a semiconductor alloy from the InAlGaN system, including, but not limited to, GaN, AlGaN, AlN, InGaN, InAlGaN, and the like.

BACKGROUND OF THE INVENTION

A conventional IQ-nitride heterojunction power semiconductor device includes one III-nitride semiconductor body of one band gap disposed over another III-nitride semiconductor body of another band gap to form a two dimensional electron gas that serves as a conduction channel between the power electrodes of the device. III-nitride heterojunction power semiconductor devices are commercially desirable because of their high band gap and high current carrying capabilities. However, a typical III-nitride power semiconductor device is normally ON. Generally speaking, a normally ON power semiconductor device is less desirable in that it requires additional circuitry to keep its channel open in order to render the same OFF.

It is, therefore, desirable to have a normally off III-nitride power semiconductor device.

Moreover, even in normally ON devices, it may be desirable to set/program the threshold voltage of the device.

SUMMARY OF THE INVENTION

A semiconductor device according to the present invention includes a first III-nitride semiconductor body having a band gap, a second III-nitride semiconductor body having another band gap over the first III-nitride semiconductor body to form a III-nitride heterojunction having a two dimensional electron gas, a first power electrode coupled to the second III-nitride semiconductor body, a second power electrode coupled to the second III-nitride semiconductor body, a gate arrangement that include a non-volatile, charged floating gate and a gate electrode arranged over the charged floating gate.

According to one aspect of the present invention the charge in the charged floating gate may be selected to interrupt the two dimensional electron gas.

According to another aspect of the present invention the charge in the charged floating gate may be selected to obtain a specific threshold voltage under the gate arrangement without interrupting the two dimensional electron gas.

In a device according to the present invention, first III-nitride semiconductor body is comprised of one semiconductor alloy from the InAlGaN system, e.g., preferably, GaN, and the second III-nitride semiconductor body is comprised of another semiconductor alloy from the InAlGaN system, e.g., preferably, AlGaN.

According to an aspect of the present invention, the gate arrangement includes a gate insulation body, e.g., $Si_3N_4$ or $SiO_2$.

A semiconductor device according to the present invention may be formed as a discrete device over a substrate such as a silicon substrate, a silicon carbide substrate, or a sapphire substrate; or it may be formed as part of an integrated circuit alongside other elements in a common semiconductor body.

Other features and advantages of the present invention will become apparent from the following description of the invention which refers to the accompanying drawings.

DETAILED DESCRIPTION OF THE FIGURES

Figure 1:
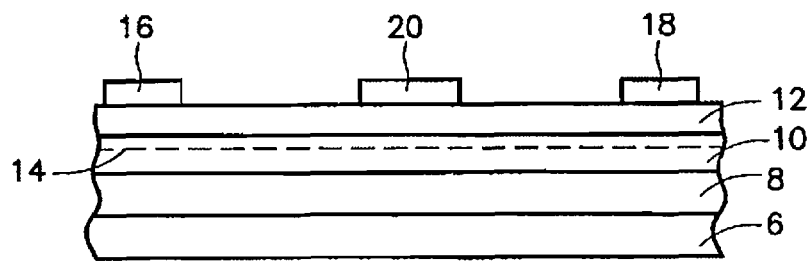
FIG. 1 schematically shows a cross-sectional view of the active region of a III-nitride power semiconductor device according to the prior art.

FIG. 1 illustrates an example of a typical III-nitride heterojunction high electron mobility transistor (HEMT). Specifically, a HEMT according to the prior art includes a first Ea-nitride semiconductor body 10 having one band gap, which may be composed of, for example, GaN, and a second M-nitride semiconductor body 12 having another band gap, which may be composed of, for example, AlGaN, disposed over first semiconductor body 10. First semiconductor body 10 may be formed over a transition body 8 composed, for example, of AlN, which is itself formed over substrate 6. As is known, transition body 8 could be a series of layers including GaN, AlGaN, AlN, InGaAlN in various orders, to relieve stress due to the mismatch of a hetero-epitaxial layer with a substrate.

As is well known, the heterojunction of first III-nitride semiconductor body 10 and second III-nitride semiconductor body 12 results in the formation of a conductive region usually referred to as a two dimensional electron gas or 2DEG 14. Current may be conducted between a first power electrode 16 (which is ohmically coupled to second semiconductor body 12), and second power electrode 18 (which is also ohmically coupled to second semiconductor body 12) through 2DEG 14.

A conventional HEMT, such as the one seen in FIG. 1, is a normally ON device. A gate structure 20 may be disposed between first power electrode 16 and second power electrode 18 in order to turn the device OFF. Gate structure 20 includes at least a gate electrode which may be electrically insulated by a gate insulation and thus capacitively coupled to second M-nitride semiconductor body 12. The application of an appropriate voltage to the gate electrode of gate structure 20 causes the interruption of 2DEG 14 thereby turning the device OFF.

Figure 2:
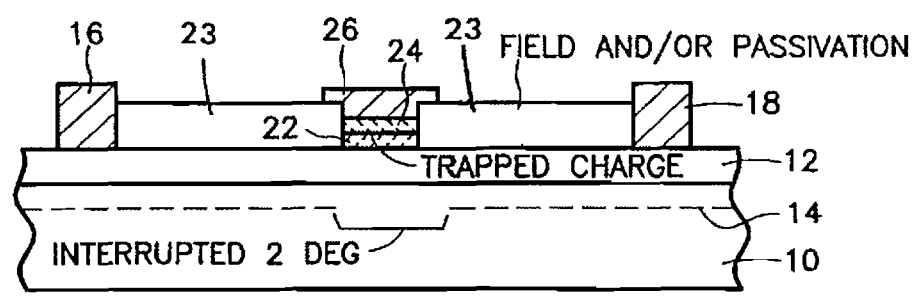
FIG. 2 schematically shows a cross-sectional view of the active region of a related III-nitride heterojunction power device.

Referring to FIG. 2, in which like numerals identify like features, a device according to copending U.S. patent application Ser. No. 11/460,725, assigned to the assignee of the present application, includes a gate structure having first insulation body 22 disposed over a portion of second III-nitride semiconductor body 12, second insulation body 24 disposed on first insulation body 22, and gate electrode 26. A field or passivation layer 23 is provided as shown. First insulation body 22 and second insulation body 24 are selected in order to create a charge trap. That is, charge can be trapped between first insulation body 22 and the second insulation body 24. The amount of trapped charge can be selected so that 2DEG 14 below gate electrode 26 is interrupted, thereby rendering the device normally OFF. An application of an appropriate voltage can then restore 2DEG 14 and render the device ON. Thus, a normally OFF switchable device can be obtained.

Figure 3:
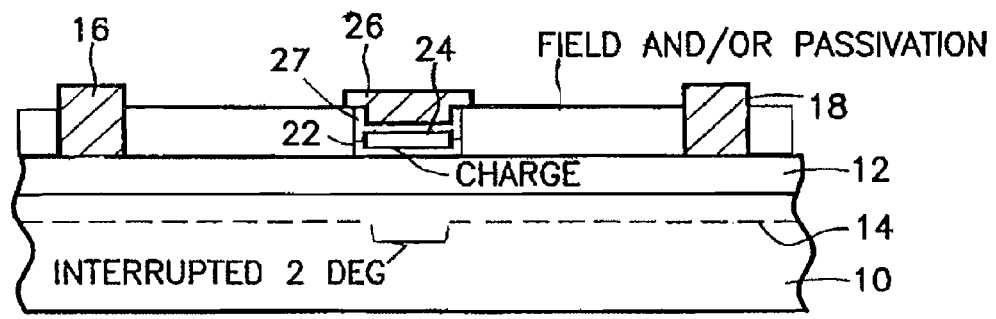
FIG. 3 schematically shows a cross-sectional view of the active region of a JR-nitride heterojunction power device according to the first embodiment of the present invention.

Referring now to FIG. 3, in which like numerals identify like features, a device according to the first embodiment of the present invention includes a gate arrangement having a non-volatile charged floating gate 24' that resides on gate insulation 22' and below gate electrode 26. Note that charged floating gate 24' and gate electrode 26 are electrically insulated from one another by an insulation spacer 27. Preferably, gate insulation 22' is formed with $Si_3N_4$, but may also be formed with $SiO_2$ or any other suitable dielectric. Moreover, insulation spacer may be formed with any suitable dielectric such as $SiO_2$, $Si_3N_4$ or the like. Non-volatile as used herein means that the charge in the charged floating gate electrode remains resident without the need for a continuous application of an external voltage.

According to one aspect of the present invention, the charge in charged floating gate 24' may be selected to interrupt 2DEG 14 below the gate arrangement, whereby the device is rendered normally OFF. Further charging of charged floating electrode 24' allows for setting of the threshold voltage (voltage required for restoring 2DEG 14 to turn the device ON). Thus, the threshold voltage of the device can be programmed.

According to another aspect of the present invention, floating gate 24' can be charged only to vary the threshold voltage (in this case the voltage required to interrupt 2DEG 14 to turn the device OFF) without actually rendering 2DEG 14 OFF. Thus, the threshold voltage of the device can be programmed without rendering the device normally OFF.

Figure 4:
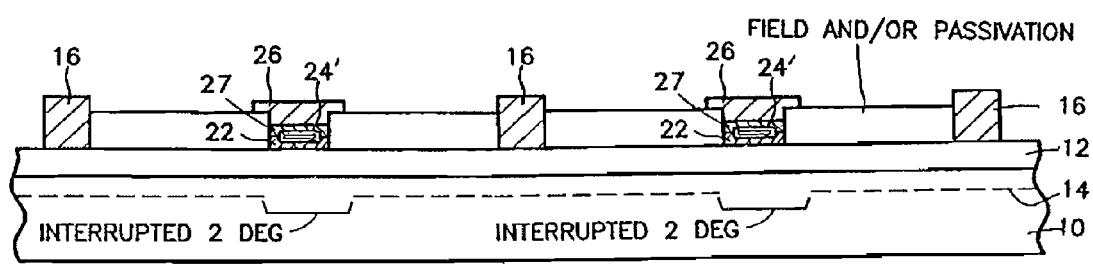
FIG. 4 schematically shows a cross-sectional view of a portion of the gate structure of a DI-nitride heterojunction power device according to the second embodiment of the present invention.

Referring next to FIG. 4, in which like numerals identify like features, a device according to the second embodiment of the present invention includes two or more gate arrangements each including a respective non-volatile charged floating gate 24', 24" to interrupt 2DEG 14 thereunder according to the present invention, each having a charge value different from the charge value of the other. Thus, for example, charged floating gate 24' may be charged to obtain a threshold voltage of +2V to turn ON 2DEG 14 thereunder and charged floating gate 24" may be charged to obtain a threshold voltage of +4V to restore 2DEG 14 thereunder.

A device according to the second embodiment is not limited to floating gates with two different charge values, but may include more than two floating gates each having its own charge value.

Floating gates in a device according to the present invention may be formed of any suitable conductive material that can be charged such as a suitable metal or a suitable polysilicon body or the like. Once formed, a floating gate can be charged using any known method such as tunneling or hot electron injection. Optionally, a floating gate in a device according to the present invention may be re-chargeable.

A device according to the present invention can be fabricated by disposing one III-nitride semiconductor body having one band gap over another III-nitride semiconductor body of another band gap to obtain a two dimensional electron gas, forming a gate insulation body over the second III-nitride semiconductor body, forming a floating gate electrode over the gate insulation body, and charging the floating gate electrode to obtain a non-volatile charged floating gate electrode. The process would also include forming power electrodes as well as forming gate electrode 26. In the preferred embodiment, insulation spacer 27 is formed over floating gate electrode 27, and gate electrode 26 is formed over spacer 27 prior to charging the floating gate electrode. Tunneling or hot electron injection may be used to charge the floating gate electrode as desired to obtain a device according to the present invention.

Substrate 6 is preferably formed from Si, but may be formed from SiC, Sapphire, or the like. Alternatively, substrate 6 may be formed from a bulk III-nitride semiconductor (e.g. bulk GaN) which is compatible with first semiconductor body 10, in which case transition body 8 may be eliminated.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A programmable III-Nitride power transistor comprising:
   a first III-nitride semiconductor body;
   a second III-nitride semiconductor body situated over said first III-nitride semiconductor body to form a two dimensional electron gas;
   a passivation layer situated over said second III-nitride semiconductor body;
   a gate arrangement disposed over said second III-nitride semiconductor body, said gate arrangement including a non-volatile floating gate situated in a trench within said passivation layer, and a gate electrode situated over said non-volatile floating gate and electrically insulated from said non-volatile floating gate by an insulation spacer in said trench, said non-volatile floating gate configured for programming said III-Nitride power transistor by a current produced in said two dimensional electron gas.

2. The programmable III-Nitride power transistor of claim 1, wherein a threshold voltage of said programmable III-Nitride power transistor is programmed by said current produced in said two dimensional electron gas.

3. The programmable III-Nitride power transistor of claim 1 further comprising first and second power electrodes coupled to said second III-nitride semiconductor body.

4. The programmable III-Nitride power transistor of claim 1, wherein said first III-nitride semiconductor body comprises GaN and wherein said second III-nitride semiconductor body comprises AlGaN.

5. The programmable III-Nitride power transistor of claim 1 further comprising a gate insulation body disposed between said non-volatile floating gate and said second III-nitride semiconductor body.

6. The programmable III-Nitride power transistor of claim 5, wherein said gate insulation body comprises silicon nitride.

7. The programmable III-Nitride power transistor of claim 1, wherein said non-volatile floating gate is charged to interrupt said two dimensional electron gas.

8. The programmable III-Nitride power transistor of claim 1 further comprising a silicon substrate.

9. The programmable III-Nitride power transistor of claim 1 further comprising a silicon carbide substrate.

10. The programmable III-Nitride power transistor of claim 1 further comprising a sapphire substrate.

11. The programmable III-Nitride power transistor of claim 1, wherein said non-volatile floating gate is negatively charged.

12. The programmable III-Nitride power transistor of claim 1, wherein said non-volatile floating gate electrode is rechargeable.

13. A method of fabricating a programmable III-Nitride power transistor, said method comprising:
- disposing a first III-nitride semiconductor body over a second III-nitride semiconductor body to form a two dimensional electron gas;
- forming a gate insulation body over said second III-nitride semiconductor body;
- forming a non-volatile floating gate over said gate insulation body, said non-volatile floating gate situated in a trench within a passivation layer;
- disposing a gate electrode over said non-volatile floating gate and electrically insulated from said non-volatile floating gate by an insulation spacer in said trench;
- charging said non-volatile floating gate by a current produced in said two dimensional electron gas to obtain a non-volatile charged floating gate electrode.

14. The method of claim 13, wherein said charging said non-volatile floating gate programs a threshold voltage of said programmable III-Nitride power transistor.

15. The method of claim 13 further comprising disposing first and second power electrodes on said second III-nitride semiconductor body.

16. The method of claim 13, wherein said first III-nitride semiconductor body comprises GaN and wherein said second III-nitride semiconductor body comprises AlGaN.

17. The method of claim 13, wherein said gate insulation body comprises silicon nitride.

18. The method of claim 13, wherein said non-volatile charged floating gate electrode interrupts said two dimensional electron gas.

19. The method of claim 13, wherein said charging said non-volatile floating gate comprises using a tunneling method.

20. The method of claim 13, wherein said charging said non-volatile floating gate comprises using hot electron injection.

* * * * *